United States Patent [19]

Lowrey et al.

[11] Patent Number: 5,331,196
[45] Date of Patent: Jul. 19, 1994

[54] ONE-TIME, VOLTAGE-PROGRAMMABLE, LOGIC ELEMENT

[75] Inventors: Tyler A. Lowrey; Ruojia Lee, both of Boise, Id.

[73] Assignee: Micron Technology, Inc., Boise, Id.

[21] Appl. No.: 114,886

[22] Filed: Aug. 31, 1993

Related U.S. Application Data

[63] Continuation of Ser. No. 746,824, Aug. 19, 1991, Pat. No. 5,241,496.

[51] Int. Cl.$^5$ .............................................. G11C 17/16
[52] U.S. Cl. .................................... 257/529; 365/96; 365/225.7; 257/530; 257/2
[58] Field of Search .................... 257/529, 530; 365/225.7, 96

[56] References Cited

U.S. PATENT DOCUMENTS

| | | | |
|---|---|---|---|
| 4,970,686 | 11/1990 | Naruke et al. | 365/96 |
| 5,134,457 | 7/1992 | Hamdy et al. | 357/51 |
| 5,241,496 | 8/1993 | Lowrey et al. | 365/96 |

Primary Examiner—Viet Q. Nguyen
Attorney, Agent, or Firm—Angus C. Fox, III

[57] ABSTRACT

A one-time, voltage-programmable, logic element has an antifuse element constructed within a trench etched in a silicon substrate. A sidewall of the trench abuts a diffusion region. The trench is lined with a nitride dielectric layer, which is in turn covered by polycrystalline silicon. The polycrystalline silicon serves as a voltage reference line. In a preferred embodiment, the diffusion region forms a first source/drain region of a field-effect transistor. In order to program the element, a voltage sufficient to rupture the nitride dielectric layer is applied between the diffusion region and the reference line. The transistor is utilized to isolate a particular logic element from other logic elements.

6 Claims, 4 Drawing Sheets

ONE-TIME, VOLTAGE-PROGRAMMABLE, LOGIC ELEMENT

This is a continuation of application Ser. No. 07/746,824, filed Aug. 19, 1991, now U.S. Pat. No. 5,241,496.

FIELD OF THE INVENTION

This invention relates to integrated circuit technology, one-time-programmable memory arrays, memory cells having an insulated-gate, field-effect transistor as the selective element, and a shortable capacitor, or anti-fuse, as the programmable element.

BACKGROUND OF THE INVENTION

Read Only Memory (ROM) are commonly used to store programs in computer systems. Although mask-programmed ROMs are the least expensive when manufactured in high volume, they have the disadvantages of high initial design cost and long lead time to manufacturing. Programmable ROMs (PROMs), of which there are many types, have the advantage of being field programmable.

Bipolar PROMs, which incorporate bipolar fusible links or vertical shorting junction elements, have typically been used for high-speed applications, despite their relatively high manufacturing cost, high power consumption, and low circuit density. Fusible links are particularly problematic. Not only are high current values required to blow the fusible links during programming, but the photolithographic and etch steps required for their formation must be precisely controlled so as to minimize process variability. Unless link size and shape is controlled within a narrow range, it will not function effectively both as a conductor if not blown and as a completely open circuit if blown.

Where speed is not of paramount importance, electrically-programmable ROMs (EPROMs) employing floating gate technology have been typically employed. Such EPROMs feature greater circuit density than bipolar EPROMs, due to a more compact cell design. However, the manufacture of floating gate EPROMs requires complicated processing. Additionally, data is retained in the floating gate, which is vulnerable to leakage and ultraviolet radiation, either of which may result in the permanent loss of data.

Various other PROM cells have been proposed that utilize antifuse elements for the programmable link. Generally, the antifuse elements are essentially capacitors, consisting of two conductive or semiconductive materials separated by a dielectric layer. During programming, the dielectric layer is broken down by the application of a programming voltage that is significantly greater than the normal read voltage, thereby electrically connecting the conducting materials.

For the PROM cells described in U.S. Pat. Nos. 3,634,929 and 4,499,557, an isolated diode is used as the selection element and a capacitor is used as the programmable antifuse element. Such designs suffer from several disadvantages. Reverse bias leakage will result in high background current values. In addition, the programming operation tends to stress the dielectric on cells which are to remain unshorted. Finally, it is difficult to balance the need to utilize a read voltage which will be sufficient to trigger the column sense amps without exerting undue stress on the dielectric of the unshorted cells during the useful life of the device.

The PROM cells described in U.S. Pat. Nos. 4,322,822 and 4,507,757 utilize a programmable antifuse capacitor in combination with a MOS transistor, which functions as the selection element. The first referenced patent discloses an electrically-programmable memory array having capacitor devices formed in anisotropically etched V-grooves, which provide enhanced dielectric breakdown at the apex of the groove. After breakdown (i.e., programming), a cell exhibits a low resistance to a grounded substrate. This cell structure is somewhat difficult to manufacture, in that it requires a highly-conductive, grounded substrate. Additionally, the design does not lend itself to high density circuit layout. The second referenced patent ('757) discloses an electrically-programmable memory array having a thin-oxide avalanche fuse element which is programmed at voltage below the oxide breakdown level. Such a design is extremely susceptible to manufacturing process variability, since the avalanche phenomenon is difficult to control.

SUMMARY OF THE INVENTION

The invention is an improved one-time, voltage-programmable, read-only memory array in which individual memory cells comprise an insulated-gate, field-effect transistor, the channel of which provides, through a voltage-programmable anti-fuse element, a current path between a reference voltage line and a bitline. The function of the cell may be compared with that of a conventional dynamic random access memory (DRAM) cell.

In a DRAM cell, charge stored within a cell capacitor is accessed through an insulated-gate field effect transistor (the access transistor), which is turned on by activating a single word line. The cell capacitor has a node called the cell plate, which is electrically common to all other cells within the array. The voltage of the cell plate is held to approximately $V_{cc}/2$ ($V_{cc}$ being the voltage supplied to the chip). A "1" is stored in the capacitor of a memory cell by charging the cell capacitor's uncommon node, or storage-node plate, to $V_{cc}$ through the access transistor. Likewise, a "0" is stored by discharging the uncommon node to $V_{ss}$ (generally ground potential) through the access transistor. The charge on the capacitor is read by first equilibrating the cell plate and all digit lines to $V_{cc}/2$. After the equilibration voltage is disconnected from the digit lines and cell plate, the access transistor is turned on, dumping the charge stored in the cell's capacitor to an interconnected digit line. If the uncommon node of the cell capacitor had been charged to $V_{cc}$, the voltage on that digit line will be increased slightly, whereas if the uncommon node had been grounded to $V_{ss}$, the voltage on that digit line will be decreased slightly. An adjacent digit line, to which no charge has been dumped during this read cycle, is used as a reference. The voltage differential between the two digit lines will be within a range of approximately 200 to 400 mV. This differential voltage is then amplified by cross-coupled N-channel and P-channel transistors (differential sense amplifiers), which pull the digit line having the slightly lower voltage to $V_{ss}$ and the digit line having the slightly higher voltage to $V_{cc}$. Once this has occurred, the voltages on the digit lines is passed out of the array to a column decoder and read by an output buffer.

Within the subject PROM array, cells have access transistors, but no cell capacitor- A reference voltage line common to all cells within the array, provides a current source which is accessible through a particular cell access transistor only if the programmable antifuse link within that cell is shorted. Since a current source is accessed through the cell transistor, differential sense amps are not required to sense a charge differential between two bitlines. Instead, a far simpler current sense amp may be used to determine cell logic states.

For the preferred embodiment of the invention, the array comprises a semiconductor substrate having a series of parallel, alternating, minimum-pitch field isolation region and active area strips, a series of parallel, minimum-pitch wordlines overlying and perpendicular to the field isolation region and active area strips, the wordlines being insulated from the active areas by a gate dielectric layer and being dielectrically insulated on their edges and upper surfaces, source/drain junction regions between each wordline pair and field isolation strip pair, a reference voltage line between and coextensive with every other wordline pair that makes anti-fuseable contact to each subjacent pair of cell junctions along its length, anti-fuseable contact for each cell being made within a trench that extends below junction depth, and is lined with conformal silicon nitride dielectric layer that breaks down when subjected to a programming voltage. A series of minimum pitch bitlines, which run parallel to the wordlines, completes the memory array. Each bitline makes direct contact with each pair of cell junctions along its length. The array is characterized by a non-folded bitline architecture.

PREFERRED EMBODIMENT OF THE INVENTION

Figure 1B:
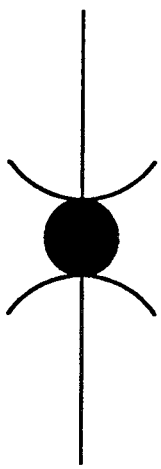
FIG. 1B is a proposed schematic symbol for a shorted antifuse element.
Figure 1A:
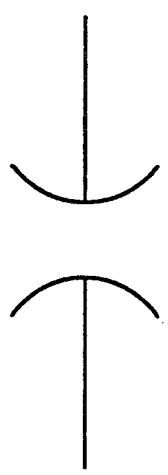
FIG. 1A is a proposed schematic symbol for a non-shorted antifuse element.

Since the charge storage characteristics of a capacitor are typically immaterial to antifuse element performance, the schematic representation of such elements using capacitor symbols is somewhat misleading. Given this realization, antifuse elements have been variously represented with gate-like and fuse-like symbols. Because of the need within this disclosure to distinguish between shorted and non-shorted antifuse elements, a new symbol is proposed. FIG. 1A depicts a non-shorted antifuse element, which consists of two curved lines separated by a gap. FIG. 1B, on the other hand, depicts a shorted antifuse element, the difference being a dot which bridges the gap between the two curved lines.

Figure 2:
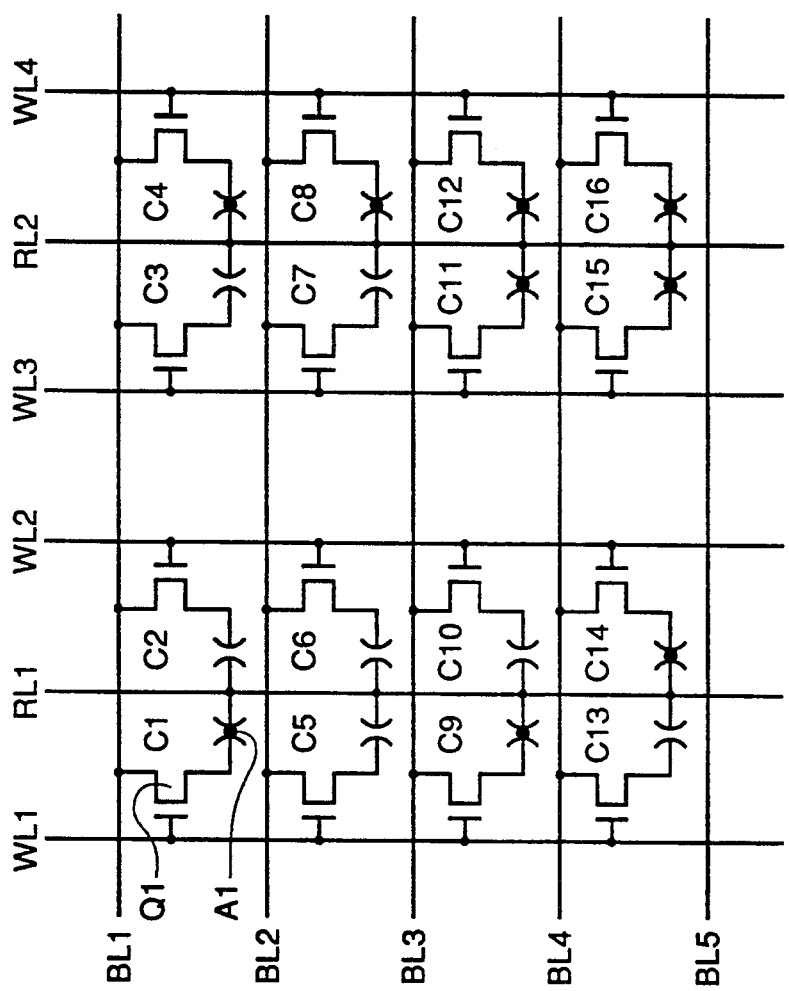
FIG. 2 is an abbreviated circuit schematic for the improved PROM array.

Referring now to the abbreviated circuit schematic of FIG. 2, the improved PROM array is shown as comprising a series of non-intersecting wordlines (WL1, WL2, WL3, and WL4), a series of reference voltage lines (RL1 and RL2), each of which is located between every wordline pair, and a series of non-intersecting bitlines (BL1, BL2, BL3, and BL4), which intersects the series of wordlines. One memory cell is associated with each wordline-bitline intersection. For example, cell C1 is associated with the intersection of wordline WL1 and bitline BL1, cell C7 with the intersection of wordline WL3 and BL2, and cell 14 with the intersection of wordline WL2 and BL4. Within each cell, a reference voltage line is coupled to a bitline via an antifuse link and a cell access transistor which is gated by the wordline associated with that cell. For example, in cell C1, reference voltage line RL1 is coupled to bitline BL1 through antifuse link A1 and access transistor Q1, which is gated by wordline WL1. If the antifuse link within a cell is shorted (i.e., conductive), then current from the reference voltage line will flow to the bitline. However, if the antifuse link is unshorted (i.e., an open circuit), no current will flow to the bitline. A "1" is permanently written to a cell within the array by applying a voltage that is greater than the breakdown voltage of the antifuse link to the bitline associated with that cell, and activating the wordline associated with the cell. In this schematic, cells C1, C4, C8, C9, C11, C12, C14, C15, and C16 are depicted as having shorted antifuse links, while the remainder of the cells are depicted as having unshorted links.

Figure 3:
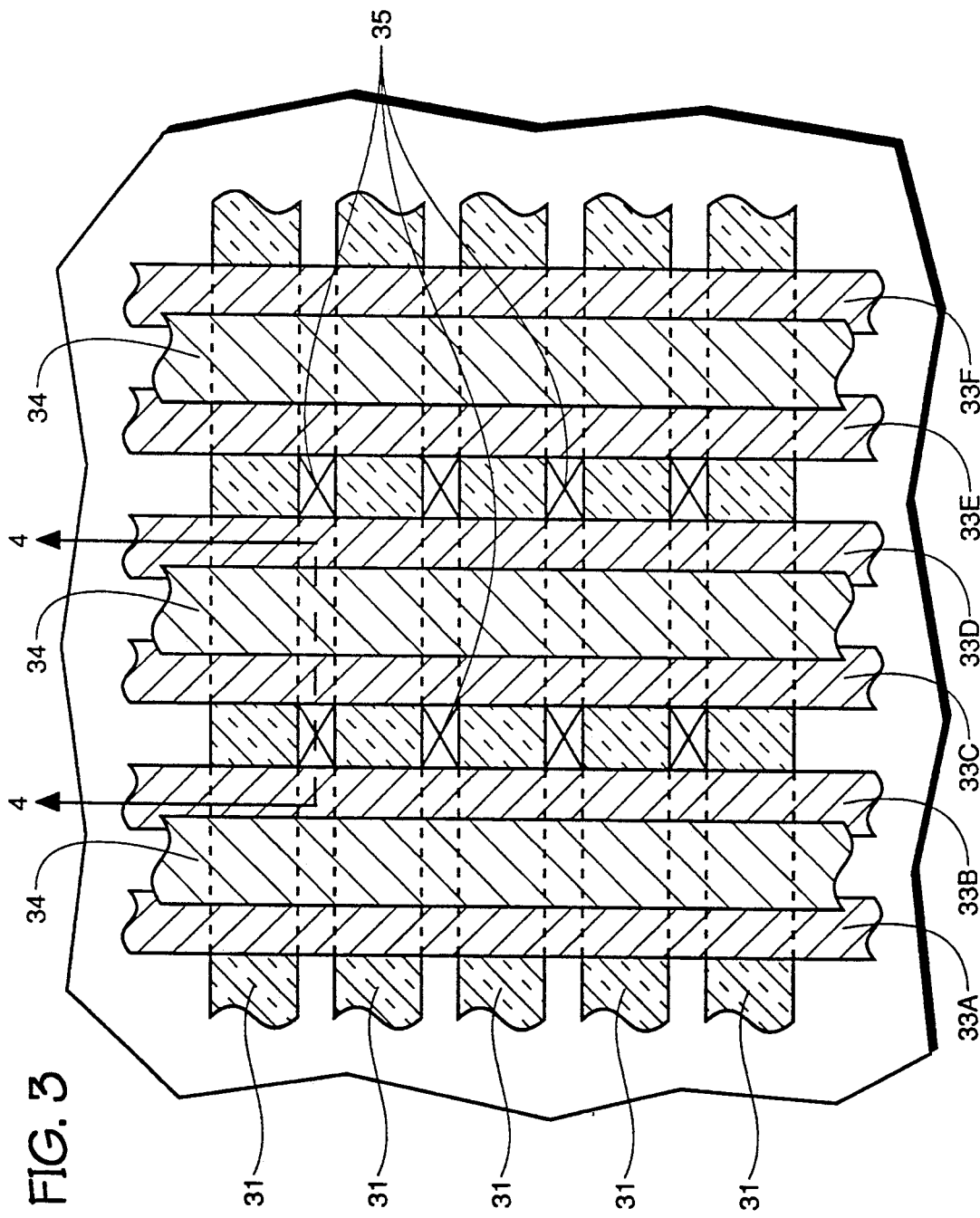
FIG. 3 is a top plan view of a portion of the improved PROM array.

The preferred embodiment of the improved PROM array will now be described with reference to both FIG. 3, which is a top plan view thereof and FIG. 4, which is a cross-sectional view through broken line 4—4 of FIG. 3. Although the process utilized to fabricate the preferred embodiment of the array is not within the scope of this disclosure, an abbreviated description of the process will be provided that should be sufficient to enable a semiconductor process engineer having ordinary skill in his art to fabricate the array. Features within the Figures will be given an item number either between 31 and 39 if they are more readily discernable in FIG. 3 or between 41 and 49 if they are more readily discernable in FIG. 4.

An array fabrication process is employed, which, at least through transistor formation, is very similar—if not identical—to processes employed to fabricate stacked-capacitor DRAM arrays. The array depicted will be fabricated utilizing N-channel devices. However, a functional array may also be fabricated on an N-type substrate by reversing implant conductivity types.

Following the creation of a series of parallel, linear field oxide regions 31 in a lightly-doped P-type silicon substrate 41, a gate oxide layer 42 is thermally grown on the surface of the active areas 32 (the substrate regions between field oxide regions 31). A series of wordlines 33A, 33B, 33C, 33D, 33E, 33F . . . . 33n (where n is the total number of wordlines in the array) is patterned from a silicon dioxide covered, refractory-metal-silicided first polycrystalline silicon (poly) layer. Thus each conductive portion of a wordline comprises a poly layer 43 and a silicide layer 44. Silicide layer 44 is covered by a silicon dioxide layer 45. Source and drain regions are then created by implanting an N-type impurity such as phosphorus, arsenic, or both. Wordline sidewall spacers are utilized to appropriately offset the implants from the channel edges. From this point, the array fabrication process departs from DRAM process flows.

Active area regions between every other wordline are then subjected to an anisotropic etch which trenches the substrate below transistor junction depth. These trenches are then lined with a conformal silicon nitride dielectric layer 46 that is approximately 50 to 100 Å in thickness. A series of parallel reference voltage lines 34 is then created in the interwordline gaps where the silicon nitride lined trenches have been created. The array is then covered with a dielectric isolation layer 47. A self-aligned bitline contact etch is then performed at the array locations 35, which are identified in FIG. 3 with a circle having an "X" therein. A series of parallel bitlines which intersect wordlines 33 and reference voltage lines 34 are then patterned from a refractory-metal-silicided second poly layer. Bitlines are thus formed which have a second poly layer component 48 and a refractory metal silicide layer component 49.

Figure 4:
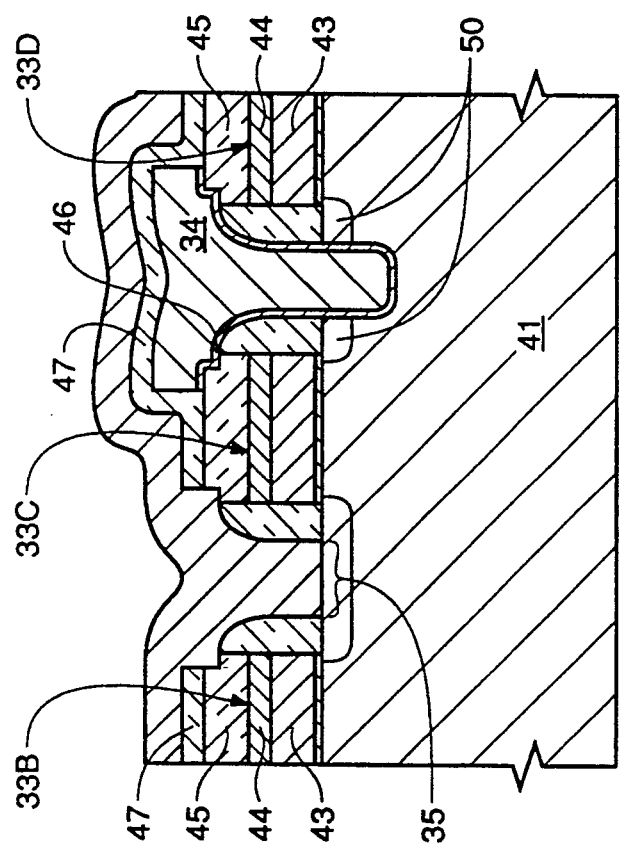
FIG. 4 is a cross-sectional view through broken line 4—4 of FIG. 3, which fully depicts a single memory cell within the array.

Referring now to FIG. 4, exclusively, it will be noted that the trench in which reference voltage line 34 rests serves a dual function- First, it electrically isolates the cells associated with wordline 33C from those associated with wordline 33D. Additionally, it provides a relatively large surface area for breakdown of the silicon nitride dielectric layer 46 to occur during high voltage programming. The programmable antifuse link consists of the silicon nitride dielectric layer 46 between the reference voltage line 34 and the adjacent transistor junction 50.

In order to program a particular cell, a selected digit-line and a selected wordline are both held at a programming potential of approximately 10-12 volts, while unselected bitlines, unselected wordlines, and reference voltage lines are held at ground potential. When this programming voltage is applied to a bitline and wordline pair, the access transistor of the cell so selected is completely turned on, and the dielectric in the antifuse link ruptures (i.e., breaks down), forming a permanent conductive path from the reference voltage line to the adjacent transistor junction.

There are two basic methods for reading the logic state stored within a particular cell. For the first method, a selected bitline is held at ground potential. The voltage applied to the remaining bitlines, although theoretically irrelevant from a logic standpoint, are also held at ground potential to eliminate potential intercircuit current leakage. A selected wordline is held within a range of approximately 4-6 volts, while unselected wordlines are held at ground potential. Voltage refence lines are held within a range of approximately 2-3 volts. If the antifuse link in a selected cell is shorted, detectable current will flow from the reference voltage line to the selected bitline. If, on the other hand, the antifuse link in the selected is not shorted, no current will flow to the selected bitline. For the second method of reading the cell logic state, a selected bitline is held at a voltage level of 2-3 volts, while unselected bitlines are once again held at ground potential to eliminate the possibility of inter-circuit current leakage. A selected wordline is held within a range of approximately 4-6 volts, while unselected wordlines are held at ground potential. Reference voltage lines are grounded. If the antifuse link in a selected cell is shorted, detectable current will flow from the selected bitline to the reference voltage line. If, on the other hand, the antifuse link in the selected is not shorted, no current will flow to the reference voltage line. This second read method has an advantage over the first method, in that reference voltage line may remain permanently grounded.

Although only a single embodiment of the improved PROM array has been disclosed, it will be obvious to those having ordinary skill in the art that changes and modifications may be made thereto without departing from the spirit and scope of the invention as claimed. For example, instead of trenching the substrate beneath the reference voltage lines and placing the silicon nitride dielectric layer beneath the reference voltage line, the substrate beneath the bitline contact may be trenched and the silicon nitride placed beneath the bitline contact. However, such a modified cell design, although workable in theory, would make programming a far more complicated task.

We claim:

1. A one-time, voltage-programmable logic element comprising:
    an insulated-gate, field-effect transistor, said transistor having a channel region within a semiconductor substrate, and first and second source/drain regions interconnected by said channel region, said first source/drain region being coupled to an output line;
    a trench within said substrate abutting said second source/drain region;
    a dielectric layer which lines said trench;
    a conductive plug within said trench, said dielectric layer being disposed between said plug and said second source/drain region, and said conductive plug being coupled to a reference voltage, 2. The one-time, voltage-programmable logic element of claim 1, wherein the dielectric layer functions as an antifuse link which, when subjected to high voltage programming, ruptures and permanently couples said conductive plug to said second source/drain region.

3. The one-time, voltage-programmable logic element of claim 2, wherein said dielectric layer comprises silicon nitride.

4. A pair of one-time voltage-programmable logic elements comprising:
    a pair of spaced-apart insulated-gate, field-effect transistors, each of said transistors having a gate which overlies and defines a channel region within a semiconductor substrate, said gate being dielectrically insulated from said substrate, each of said transistors also having first and second source/drain regions interconnected by that transistor's channel region, said first source/drain region of each transistor being coupled to an output line;
    a trench extending downwardly into the substrate between said pair of transistors, said trench abutting said first source/drain region of each transistor;
    a dielectric layer which lines said trench; and
    a conductive plug which fills said trench and extends upwardly from the substrate, said plug being dielectrically insulated from the gate of each transistor, said dielectric layer being disposed between said plug and said second source/drain region of each transistor, said conductive plug being coupled to a reference voltage.

5. The pair of one-time voltage-programmable logic elements of claim 4, wherein said dielectric layer comprises silicon nitride.

6. The pair of one-time, voltage-programmable logic elements of claim 5, wherein the dielectric layer forms an antifuse link for each transistor, either of which may be selectively ruptured so as to couple said conductive plug to the second source/drain region of either transistor by applying a programming voltage between the conductive plug and the first source/drain region, and activating the gate of the transistor associated with the link to be programmed so that a voltage is seen across the link to be programmed that exceeds its breakdown voltage.

* * * * *